United States Patent [19]
Lu et al.

[11] Patent Number: 6,157,328
[45] Date of Patent: Dec. 5, 2000

[54] METHOD AND APPARATUS FOR DESIGNING A CODEBOOK FOR ERROR RESILIENT DATA TRANSMISSION

[75] Inventors: Ning Lu, Mountain View; Chi-Wah Kok, Fremont, both of Calif.

[73] Assignees: Sony Corporation, Tokyo, Japan; Sony Electronics, Inc., Park Ridge, N.J.

[21] Appl. No.: 09/177,781

[22] Filed: Oct. 22, 1998

[51] Int. Cl.$^7$ .............................. H03M 7/40; H03M 7/00
[52] U.S. Cl. ................................................ 341/67; 341/94
[58] Field of Search ....................................... 341/67, 94

[56] References Cited

U.S. PATENT DOCUMENTS

| | | | |
|---|---|---|---|
| 5,418,531 | 5/1995 | Laroia | 341/94 |
| 5,745,504 | 4/1998 | Bang | 341/94 |

OTHER PUBLICATIONS

ISO/IEC JTC1/SC29/WG11 N1873: *Description of Error Resilient Core Experiments*, core experiment E3d, Oct. 1997.

Primary Examiner—Trong Phan
Attorney, Agent, or Firm—Blakely, Sokoloff, Taylor & Zafman LLP

[57] ABSTRACT

A method and an apparatus for designing a codebook error resilient data transmission is disclosed. The present invention allows for creation of a robust yet compressive codebook for transmission of data. One embodiment of the present invention utilizes a combination of Huffman and Gray coding techniques to achieve both robustness and high compression ratios for data sets of single or multiple dimension. In particular, the present invention utilizes a series of Gray codes to improve the robustness of a Huffman code utilized by the MPEG-4 standard for motion video compression. The present invention may also be used to create codebooks for other forms of data, these codebooks can be designed to be robust or robust and compressive, and can encode data of single or multi-dimensional format.

6 Claims, 20 Drawing Sheets

| INDEX | VECTOR | DIFFERENCE | BIT | CODES |
|---|---|---|---|---|
| 0 | -16 | 16 | 13 | 0000 0000 0010 1 |
| 1 | -15.5 | 16.5 | 13 | 0000 0000 0011 1 |
| 2 | -15 | 17 | 12 | 0000 0000 0101 |
| 3 | -14.5 | 17.5 | 12 | 0000 0000 0111 |
| 4 | -14 | 18 | 12 | 0000 0000 1001 |
| 5 | -13.5 | 18.5 | 12 | 0000 0000 1011 |
| 6 | -13 | 19 | 12 | 0000 0000 1101 |
| 7 | -12.5 | 19.5 | 12 | 0000 0000 1111 |
| 8 | -12 | 20 | 12 | 0000 0001 001 |
| 9 | -11.5 | 20.5 | 12 | 0000 0001 011 |
| 10 | -11 | 21 | 11 | 0000 0001 101 |
| 11 | -10.5 | 21.5 | 11 | 0000 0001 111 |
| 12 | -10 | 22 | 11 | 0000 0010 001 |
| 13 | -9.5 | 22.5 | 11 | 0000 0010 011 |
| 14 | -9 | 23 | 11 | 0000 0010 101 |
| 15 | -8.5 | 23.5 | 11 | 0000 0010 111 |
| 16 | -8 | 24 | 11 | 0000 0011 001 |
| 17 | -7.5 | 24.5 | 11 | 0000 0011 011 |
| 18 | -7 | 25 | 11 | 0000 0011 101 |
| 19 | -6.5 | 25.5 | 11 | 0000 0011 111 |
| 20 | -6 | 26 | 11 | 0000 0100 001 |
| 21 | -5.5 | 26.5 | 10 | 0000 0100 11 |
| 22 | -5 | 27 | 10 | 0000 0101 01 |
| 23 | -4.5 | 27.5 | 10 | 0000 0101 11 |
| 24 | -4 | 28 | 8 | 0000 0111 |
| 25 | -3.5 | 28.5 | 8 | 0000 1001 |
| 26 | -3 | 29 | 8 | 0000 1011 |
| 27 | -2.5 | 29.5 | 7 | 0000 111 |
| 28 | -2 | 30 | 5 | 0001 1 |
| 29 | -1.5 | 30.5 | 4 | 0011 |
| 30 | -1 | 31 | 3 | 011 |
| 31 | -0.5 | 31.5 | 1 | 1 |
| 32 | 0 |  |  |  |
| 33 | 0.5 | -31.5 | 3 | 010 |
| 34 | 1 | -31 | 4 | 0010 |
| 35 | 1.5 | -30.5 | 5 | 0001 0 |
| 36 | 2 | -30 | 7 | 0000 110 |
| 37 | 2.5 | -29.5 | 8 | 0000 1010 |
| 38 | 3 | -29 | 8 | 0000 1000 |
| 39 | 3.5 | -28.5 | 8 | 0000 0110 |
| 40 | 4 | -28 | 10 | 0000 0101 10 |
| 41 | 4.5 | -27.5 | 10 | 0000 0101 00 |
| 42 | 5 | -27 | 10 | 0000 0100 10 |
| 43 | 5.5 | -26.5 | 11 | 0000 0100 010 |
| 44 | 6 | -26 | 11 | 0000 0100 000 |
| 45 | 6.5 | -25.5 | 11 | 0000 0011 110 |
| 46 | 7 | -25 | 11 | 0000 0011 100 |
| 47 | 7.5 | -24.5 | 11 | 0000 0011 010 |
| 48 | 8 | -24 | 11 | 0000 0011 000 |
| 49 | 8.5 | -23.5 | 11 | 0000 0010 110 |
| 50 | 9 | -23 | 11 | 0000 0010 100 |
| 51 | 9.5 | -22.5 | 11 | 0000 0010 010 |
| 52 | 10 | -22 | 11 | 0000 0010 000 |
| 53 | 10.5 | -21.5 | 11 | 0000 0001 110 |
| 54 | 11 | -21 | 11 | 0000 0001 100 |
| 55 | 11.5 | -20.5 | 12 | 0000 0001 010 |
| 56 | 12 | -20 | 12 | 0000 0001 000 |
| 57 | 12.5 | -19.5 | 12 | 0000 0000 1110 |
| 58 | 13 | -19 | 12 | 0000 0000 1100 |
| 59 | 13.5 | -18.5 | 12 | 0000 0000 1010 |
| 60 | 14 | -18 | 12 | 0000 0000 1000 |
| 61 | 14.5 | -17.5 | 12 | 0000 0000 0110 |
| 62 | 15 | -17 | 12 | 0000 0000 0100 |
| 63 | 15.5 | -16.5 | 13 | 0000 0000 0011 0 |

| | | | | 1000<br>0111 | | | | |
|---|---|---|---|---|---|---|---|---|
| | | 0011<br>00011 | 0100<br>0011 | 100<br>011 | 0100<br>0011 | 0010<br>00011 | | |
| | 00011<br>0011 | 0011<br>0011 | 0100<br>11 | 100<br>11 | 0100<br>11 | 0010<br>0011 | 00010<br>0011 | |
| | 0001<br>1011 | 0011<br>011 | 011<br>011 | 011 | 010<br>011 | 0010<br>011 | 0001<br>0011 | |
| 0000<br>1111 | 000<br>111 | 001<br>11 | 011 | 11 | 0101 | 001<br>01 | 000<br>101 | 0000<br>1101 |
| | 0001<br>1010 | 0011<br>010 | 011<br>010 | 1010 | 010<br>010 | 0010<br>010 | 0001<br>0010 | |
| | 00011<br>0010 | 0011<br>0010 | 0110<br>010 | 100<br>10 | 0100<br>010 | 0010<br>0010 | 00010<br>0010 | |
| | | 0011<br>00010 | 0110<br>0010 | 100<br>010 | 0100<br>0010 | 0010<br>00010 | | |
| | | | | 1000<br>0110 | | | | |

FIG. 1C
(PRIOR ART)

| 000 |
|---|
| 001 |
| 011 |
| 010 |
| 110 |
| 111 |
| 101 |
| 100 |

| 0000 | 0010 | 1010 | 1000 |
|------|------|------|------|
| 0001 | 0011 | 1011 | 1001 |
| 0101 | 0111 | 1111 | 1101 |
| 0100 | 0110 | 1110 | 1100 |

| 0100 | 0110 | 1110 | 1100 |
|------|------|------|------|
| 0000 | 0010 | 1010 | 1000 |
| 0001 | 0011 | 1011 | 1001 |
| 0101 | 0111 | 1111 | 1101 |

FIG. 7

| 0000 | 0010 | 1010 | 1000 |
|------|------|------|------|
| 0001 | 0011 | 1011 | 1001 |
| 0101 | 0111 | 1111 | 1101 |
| 0100 | 0110 | 1110 | 1100 |

| 1000 | 0000 | 0010 | 1010 |
|------|------|------|------|
| 1001 | 0001 | 0011 | 1011 |
| 1101 | 0101 | 0111 | 1111 |
| 1100 | 0100 | 0110 | 1110 |

FIG. 8

| | | | | 0001<br>0001 | | | | |
|---|---|---|---|---|---|---|---|---|
| | | 1000<br>01111 | 0001<br>1001 | 100<br>101 | 0001<br>0011 | 1000<br>01110 | | |
| | 0000<br>11111 | 0001<br>1011 | 100<br>100 | 000<br>101 | 001<br>101 | 0011<br>0011 | 0000<br>11011 | |
| | 0001<br>1010 | 100<br>010 | 100<br>110 | 0111 | 001<br>001 | 011<br>001 | 0011<br>0001 | |
| 0001<br>0010 | 100<br>111 | 100<br>011 | 1011 | 11 | 0101 | 011<br>011 | 010<br>001 | 0010<br>0001 |
| | 0011<br>0010 | 000<br>111 | 001<br>111 | 1010 | 010<br>010 | 010<br>011 | 0010<br>0011 | |
| | 0000<br>11110 | 0010<br>0010 | 001<br>110 | 001<br>010 | 011<br>010 | 0110<br>0011 | 0000<br>11010 | |
| | | 1000<br>01101 | 0110<br>0010 | 001<br>011 | 0100<br>0011 | 1000<br>01100 | | |
| | | | | 0100<br>0010 | | | | |

FIG. 11C

| 000000 | 000010 | 001010 | 001000 | 101000 | 101010 | 100010 | 100000 |
|--------|--------|--------|--------|--------|--------|--------|--------|
| 000001 | 000011 | 001011 | 001001 | 101001 | 101011 | 100011 | 100001 |
| 000101 | 000111 | 001111 | 001101 | 101101 | 101111 | 100111 | 100101 |
| 000100 | 000110 | 001110 | 001100 | 101100 | 101110 | 100110 | 100100 |
| 010100 | 010110 | 011110 | 011100 | 111100 | 111110 | 110110 | 110100 |
| 010101 | 010111 | 011111 | 011101 | 111101 | 111111 | 110111 | 110101 |
| 010001 | 010011 | 011011 | 011001 | 111001 | 111011 | 110011 | 110001 |
| 010000 | 010010 | 011010 | 011000 | 111000 | 111010 | 110010 | 110000 |

1252    1251

1251

|        |        |        | 001001 |        |        |        |
|--------|--------|--------|--------|--------|--------|--------|
|        |        | 001111 | 001101 | 101101 |        |        |
|        | 000110 | 001110 | 001100 | 101100 | 101110 |        |
| 010100 | 010110 | 011110 | 011100 | 111100 | 111110 | 110110 |
|        | 010111 | 011111 | 011101 | 111101 | 111111 |        |
|        |        | 011011 | 011001 | 111001 |        |        |
|        |        |        | 011000 |        |        |        |

FIG. 12B

METHOD AND APPARATUS FOR DESIGNING A CODEBOOK FOR ERROR RESILIENT DATA TRANSMISSION

BACKGROUND OF THE INVENTION

1. Field of the Invention

The present invention relates generally to the field of data encoding and particularly to encoding of motion picture video data.

2. Description of the Related Art

It is well known in the art to encode data in order to compress the data or to make the data less prone to errors during transmission or storage. Typically, these two objectives are seen as mutually exclusive, since making transmission of data less prone to errors usually involves adding error-correcting information to the data, whereas compression of the data involves eliminating redundant portions of the data. Huffman codes are variable length codes and have been considered excellent codes for compression of information. A necessary and sufficient condition to qualify a code as a Huffman code is that no individual code is identical to the initial bits of any other individual code. For example, if one code in a Huffman code is '11' then no other codes can start with '11', codes such as '111', '110', '1111' and the like cannot be used.

Alternatively, Gray codes have been considered excellent codes for minimizing noise and therefore errors. Gray codes have the property that for each individual code in an enumerated sequence, both the next code in order and the previous code in order can be obtained by changing only one bit of the current code. These properties can result in fewer errors and less catastrophic errors because an error of a single bit is likely to result in a code for something close in sequence to the intended data. Gray codes are necessarily fixed-length codes.

In the area of transmission and encoding of motion picture video data, a well known standard is the MPEG (Motion Picture Experts Group) 4 standard, which describes a method for compressing motion picture video data for transmission. See MPEG-4, Coding of Moving Pictures and Audio, ISO/IEC JTC1 SC29 WG11. The MPEG-4 standard uses a variable length Huffman code to compress video data, thereby allowing large amounts of data to be transmitted in a short period of time. Also well known in the art is the JPEG (Joint Photographic Experts Group) standard for encoding of pictures. See ISO/IEC JTC1 SC29 WG1, JPEG, IS 10918/1. The JPEG standard provides a well known system for encoding pictures in a compressed format.

Figure 1A:
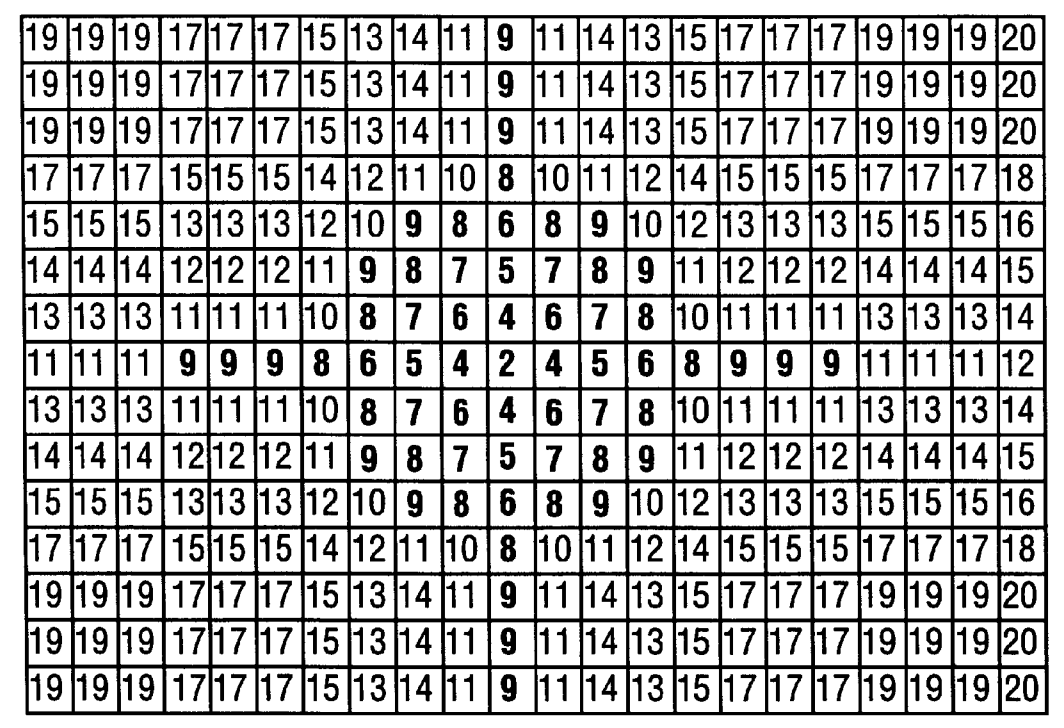

FIG. 1a shows a bit length chart for the MPEG-4 standard. Each box represents a motion vector that would be transmitted to indicate that a portion of a video image moved a direction and distance corresponding to the location of the box. The number in each box indicates how many bits are required to encode the motion vector corresponding to that location.

FIG. 1b shows a table of bit codes for the MPEG-4 standard. Each code corresponds to a certain distance along one of the two axes (either X or Y) available on a video screen. This code is generated as a Huffman code, so a high compression ratio to the original data has been achieved.

FIG. 1c shows a chart of the codes used for motion vectors in the MPEG-4 standard. Each box contains the code for a motion vector indicating motion in the direction of that box from the center box and proportional to that box's distance from the center box. These codes contain an X and Y component, each of variable length. The X and Y components can be read from the table of bit codes illustrated by FIG. 1b. For example, the code for the box one box above and one box to the right of the center box is '010 011' and '0110 011' is the code for the box two boxes above and one box to the left of the center box. Likewise, '11' is the code for the center box, representing zero boxes from the center in the X direction and zero boxes from the center in the Y direction.

Figure 2:
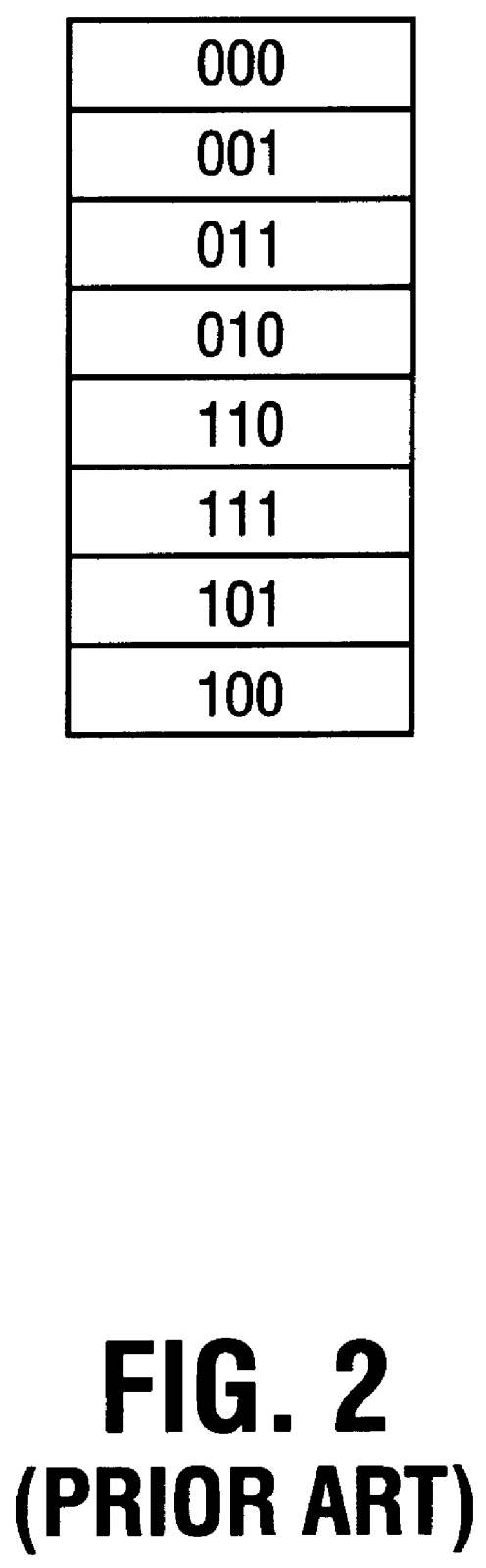

FIG. 2 illustrates a 3 bit Gray code. As can be seen, the difference between any code in the table and the code adjacent to it, either above or below, involves a single bit transition. Also notable is that Gray codes are circular in nature, the last entry in the table '100' and the first entry in the table '000' involve only one bit transition.

As has been mentioned, one disadvantage of a Huffman code is that it is typically not robust. Likewise, one disadvantage of a Gray code is that it does not achieve much compression of data relative to other encoding methods. What is desired is a robust encoding method that still achieves high data compression.

In the case of MPEG-4, high compression is achieved, but robust encoding is not. Therefore, a more robust encoding method for MPEG-4 motion vectors is desirable, while maintaining a high level of data compression.

SUMMARY OF THE INVENTION

A method and an apparatus for designing a codebook in a data encoding system is disclosed. In one embodiment, the method for designing the codebook involves selecting a set of data to encode, generating a set of codes sufficient to encode the set of data, eliminating unusable codes from the set of codes, and matching the remaining codes of the set of codes to the set of data. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 1a is a Prior Art Bit Length Chart for the MPEG-4 Video Standard.

FIG. 1b is a Prior Art Table of Bit Codes for the MPEG-4 Video Standard.

FIG. 1c is a Prior Art Chart of the codes for Motion Vectors under the MPEG-4 Video Standard.

FIG. 2 is a Prior Art 3 Bit Gray code.

FIG. 3b is a flowchart illustrating steps for creating a two dimensional codebook of general size using repeated iteration of the steps of FIG. 3a.

FIG. 5a is a 2×2 codebook with Gray code type properties.

FIG. 5b is an illustration of the relationship between the 2×2 codebook of FIG. 5a and a 4×4 codebook that can be generated from the codebook of FIG. 5a by following the process of FIG. 3a.

FIG. 6a is an illustration of the relationship between the 4×4 codebook of FIG. 5b and an 8×8 codebook that can be generated from the codebook of FIG. 5b by following the process of FIG. 3a.

FIG. 6b is an illustration of the relationship between the 4×4 codebook of FIG. 5b and an 8×4 codebook that can be generated from the codebook of FIG. 5b by following the process of FIG. 3a.

FIG. 7 is an illustration of the rotation of a row of the 4×4 codebook of FIG. 5b from the bottom to the top of the array.

FIG. 8 is an illustration of the rotation of a column of the 4×4 codebook of FIG. 5b from the left side to the right side of the array.

FIG. 11c is an MPEG-4 style codebook with codes for the center locations replaced by codes generated utilizing the processes of FIGS. 11a and 11b.

FIG. 12b is a possible codebook for the MPEG-4 standard in accordance with the method of FIG. 12a.

DETAILED DESCRIPTION

A method and an apparatus for designing a codebook error resilient data transmission is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

Figure 3A:
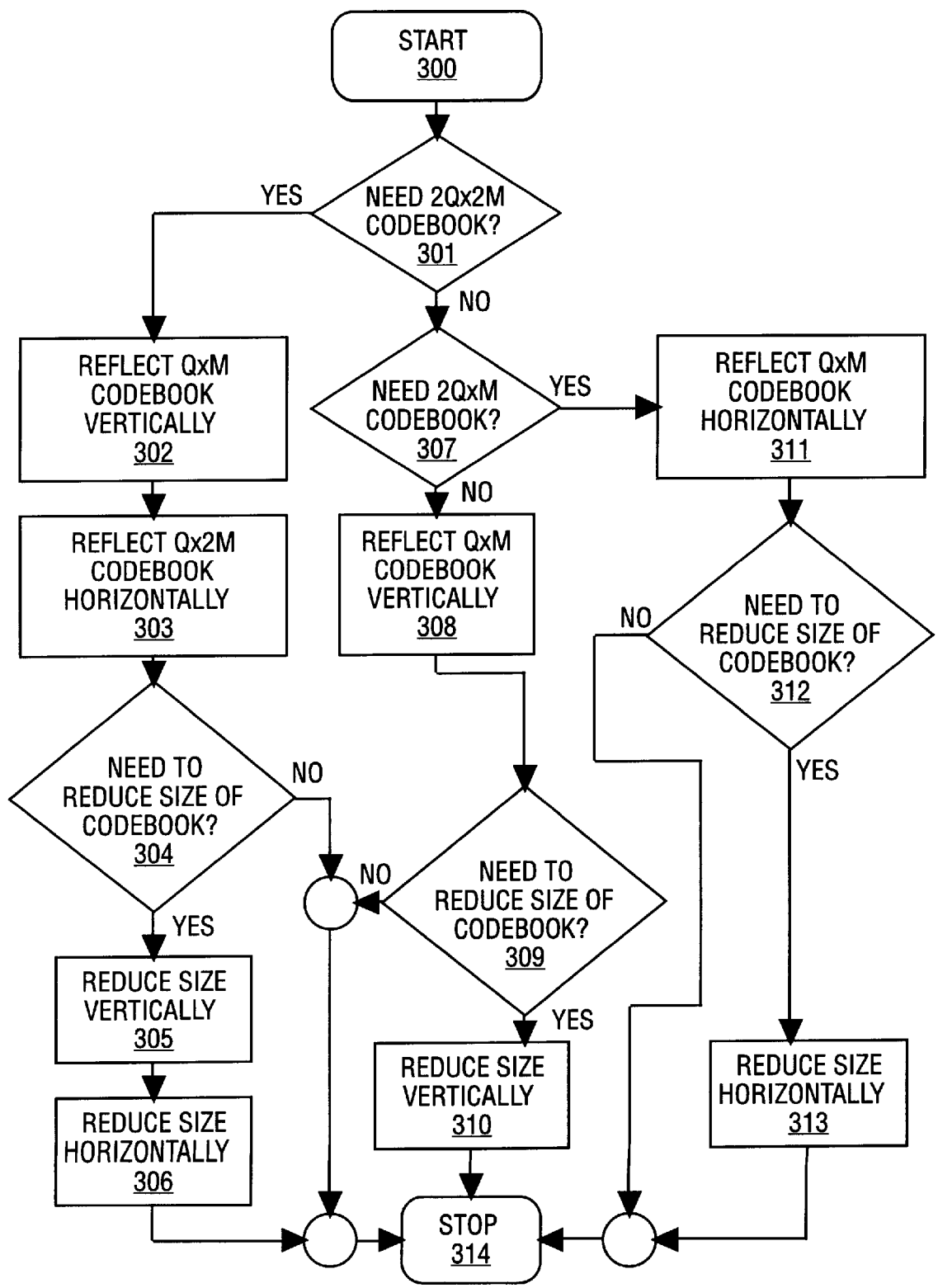
FIG. 3a is a flowchart illustrating steps for creating a two dimensional codebook with Gray code type properties in accordance with one embodiment of the present invention.

FIG. 3a is a flowchart illustrating steps for creating a desired two dimensional codebook with Gray code type properties (or multi-dimensional Gray code properties) starting with a known or initial two dimensional codebook with Gray code type properties of smaller size (also a first codebook). From Start 300, the process involves Determining step 301, where it is determined whether a fourfold expansion of the codebook, from an initial size codebook to an incrementally larger size codebook (or second codebook) is necessary. In this case, the incrementally larger size codebook is quadruple the size of the initial codebook. A quadruple size codebook is necessary if a codebook that is both longer than Q entries and wider than M entries is needed.

If a quadruple size codebook is necessary then the process flows to step 302, where the normal size codebook of dimension Q×M is reflected vertically. Reflecting the codebook vertically involves creating a mirror image of the codebook along a vertical axis at the rightmost side of the codebook. The resulting codebook is of dimension Q×2M, with the leftmost Q×M entries made up of a leading zero prepended to the original codes of the normal size codebook, and the rightmost Q×M entries made up of a leading one prepended to the original codes of the normal size codebook in horizontally reversed positions. As will be seen, the Q×2M codebook produced at this point has the Gray code type property of only requiring a change of a single bit for any move from one location to an adjacent location, even when wrapping around the edges of the codebook.

After the Q×2M codebook is created, the process flows to step 303 which involves reflecting the codebook horizontally. Reflecting the codebook horizontally involves creating a mirror image of the codebook along a horizontal axis at the bottom of the codebook. Since the process starts with the Q×2M codebook, the resulting codebook is the quadruple size codebook of dimension 2Q×2M, the incrementally larger codebook. Similarly to the vertical reflection process, the topmost Q×2M entries in the resulting codebook are made up of a leading zero prepended to the original codes of the Q×2M codebook. Likewise, the bottommost Q×2M entries in the resulting codebook are made up of a leading one prepended to the original codes of the Q×2M codebook in vertically reversed positions. See FIG. 4 for an example of the relationships between a codebook of size P×N and a codebook of size Q×M where the codebook of size Q×M is generated from the codebook of size P×N. Note that at this point, the codebook still exhibits the Gray code type property of having a one bit change for any move from one entry to an adjacent entry.

After reflecting the codebook horizontally, the process flows to Determining step 304, where it must be determined whether the size of the codebook needs to be reduced. The codebook must be reduced in size if the desired codebook is either shorter than 2Q-1 entries or narrower than 2M-1 entries. If the codebook need not be reduced in size, then the process flows to point 314, the stop point, and the incrementally larger codebook is the desired codebook.

If the codebook does need to be reduced in size, the process flows to Reducing Vertically step 305, and reducing of size vertically commences. To reduce size vertically, pairs of columns in the codebook are removed from the center of the quadruple size codebook. For instance, if the desired codebook is of size 2Q-4×2M, the four centermost columns of the codebook would be removed. By removing the centermost columns in pairs, the Gray code type property of having only a single bit transition when moving from one entry to an adjacent entry is preserved. Thus, the dimensions of the codebook will always be even numbers, if a codebook of 2Q-3×2M is desired, a codebook of size 2Q-2×2M, or 2Q×2M with the two centermost columns removed, would be produced, and then one column of entries would not be used. Note that this should not be taken to mean that a codebook of odd size could not be produced nor that an odd number of data points could be encoded. It will be readily apparent to those skilled in the art that this methodology can be adapted to producing codebooks of any size or shape in any number of dimensions.

Once the codebook is reduced in size vertically, the codebook will be reduced in size horizontally at Reducing Horizontally step 306. To reduce in size horizontally, the centermost rows of the codebook are removed in much the same manner as the centermost columns are removed during the vertical reduction step. If a 2Q−2×2M−2 codebook is desired, the step of reducing vertically creates a 2Q−2×2M codebook, and this step in turn removes the two centermost rows to create the 2Q−2×2M−2 codebook. Again, the practice of removing centermost rows preserves the Gray code type property of having only a single changed bit when moving from one entry in the table to an adjacent entry. After reducing the table horizontally, the process is complete, the process flows to point 314, the stop point, and a codebook of desired size (a third codebook) has been created.

If, at Determining step 301, it is determined that a fourfold expansion of the codebook is not necessary then a double size codebook is needed, and the double size codebook will be an incrementally larger codebook. A double size codebook is necessary if a codebook that is longer than Q entries but not wider than M entries or that is not longer than Q entries but wider than M entries is needed. As such, the process flows to Determining step 307. At Determining step 307, if it is determined that a codebook longer than Q entries is needed then the process flows to step 311.

At Reflecting Horizontally step 311, the Q×M codebook is reflected horizontally. This step is similar to step 306, but the starting codebook is of size Q×M. As a result, the resulting codebook is a double size codebook of size 2Q×M. The topmost Q×M entries of the double size codebook are made up of a leading zero prepended to the original Q×M entries of the original codebook. The bottommost Q×M entries of the double size codebook are made up of a leading one prepended to the original Q×M entries in vertically reversed positions.

After reflecting the codebook horizontally, the process flows to Determining step 312, where it is determined whether the codebook needs to be reduced in size horizontally. A codebook of size 2Q×M needs to be reduced in size horizontally if the desired height of the codebook is less than 2Q−1. If it does not need to be reduced in size horizontally, then the process is over, flowing to stop point 314, and the desired codebook has been produced. If it does need to be reduced in size horizontally, the process flows to Reducing Horizontally step 313, reducing the size of the codebook horizontally.

To reduce the size of the codebook horizontally, the same method of removing the centermost rows that was applied in step 306 is applied. Following this, the process is complete, the process flows to stop point 314, and the desired codebook has been produced. As will be noted, whether the codebook is reduced in size or not, the Gray code type property of changing only one bit when moving from one entry to the next is preserved.

If at Determining step 307 it is determined that a codebook wider than M entries is needed then the process flows to Reflecting Vertically step 308. At Reflecting Vertically step 308, the Q×M codebook is reflected vertically, resulting in a Q×2M codebook identical to the codebook produced by step 302. Following Reflecting Vertically step 308, the process flows to Determining step 309, where it is determined whether the codebook needs to be reduced vertically. The codebook needs to be reduced vertically if the desired codebook is narrower than 2M−1 columns. If the codebook does not need to be reduced, then the process flows to stop point 314 and the desired codebook has been produced.

If it is determined at step 309 that the codebook does need to be reduced vertically the process flows to Reducing Vertically step 310. At Reducing Vertically step 310 the size of the codebook is reduced vertically as it was in step 305 by removing the centermost columns in an amount sufficient to produce the desired codebook. Finally, the process flows to stop point 314 and the desired codebook has been generated.

Figure 3B:
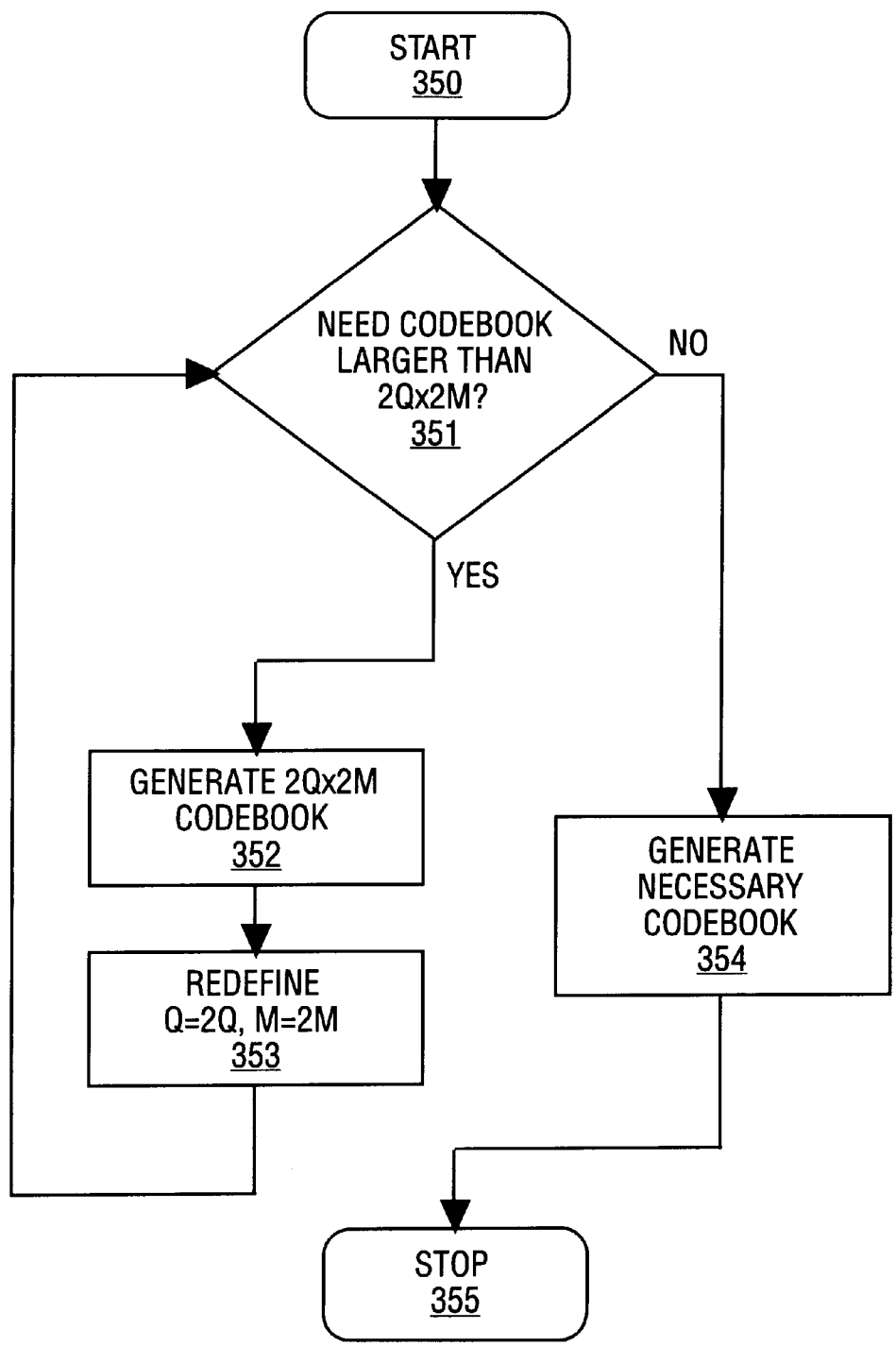

FIG. 3b is a flowchart illustrating steps for creating a two dimensional codebook of general size using repeated iteration of the steps of FIG. 3a. Illustrating by example, the process starts with a 2×2 codebook and a 6×6 codebook is needed. The process of FIG. 3b starts with Start Point 350. It then flows to Determination step 351, where it is determined whether the desired codebook is larger than 2Q×2M in size. Starting with a 2×2 codebook means that Q=2 and M=2, so a codebook of 2Q×2M size would be a 4×4 codebook. Since a 6×6 codebook is needed, a codebook larger than 2Q×2M in size is needed.

As a result, the process flows to Generation step 352, which involves using the method of FIG. 3a to generate a 2M×2Q codebook. In this case, the normal size codebook that begin the process is a 2×2 codebook and the quadruple size codebook that results is a 4×4 codebook. After generation of the 4×4 codebook, the process flows to Redefinition step 353, where Q is redefined to be 4 and M is likewise redefined to be 4. This step makes a 4×4 codebook a normal codebook for the next iteration of the process.

The process then flows to Determining step 351 again. Since the desired codebook is 6×6 and the normal codebook is 4×4, a codebook larger than 2Q×2M is not needed. As a result, the process flows to Generation step 354. Generation step 354 utilizes the same method of FIG. 3a to generate a 6×6 codebook. In brief, an 8×8 codebook is generated and then it is reduced vertically by two columns and horizontally by two rows. Finally, the process flows to stop point 355, the desired 6×6 codebook has been produced.

Figure 4A:
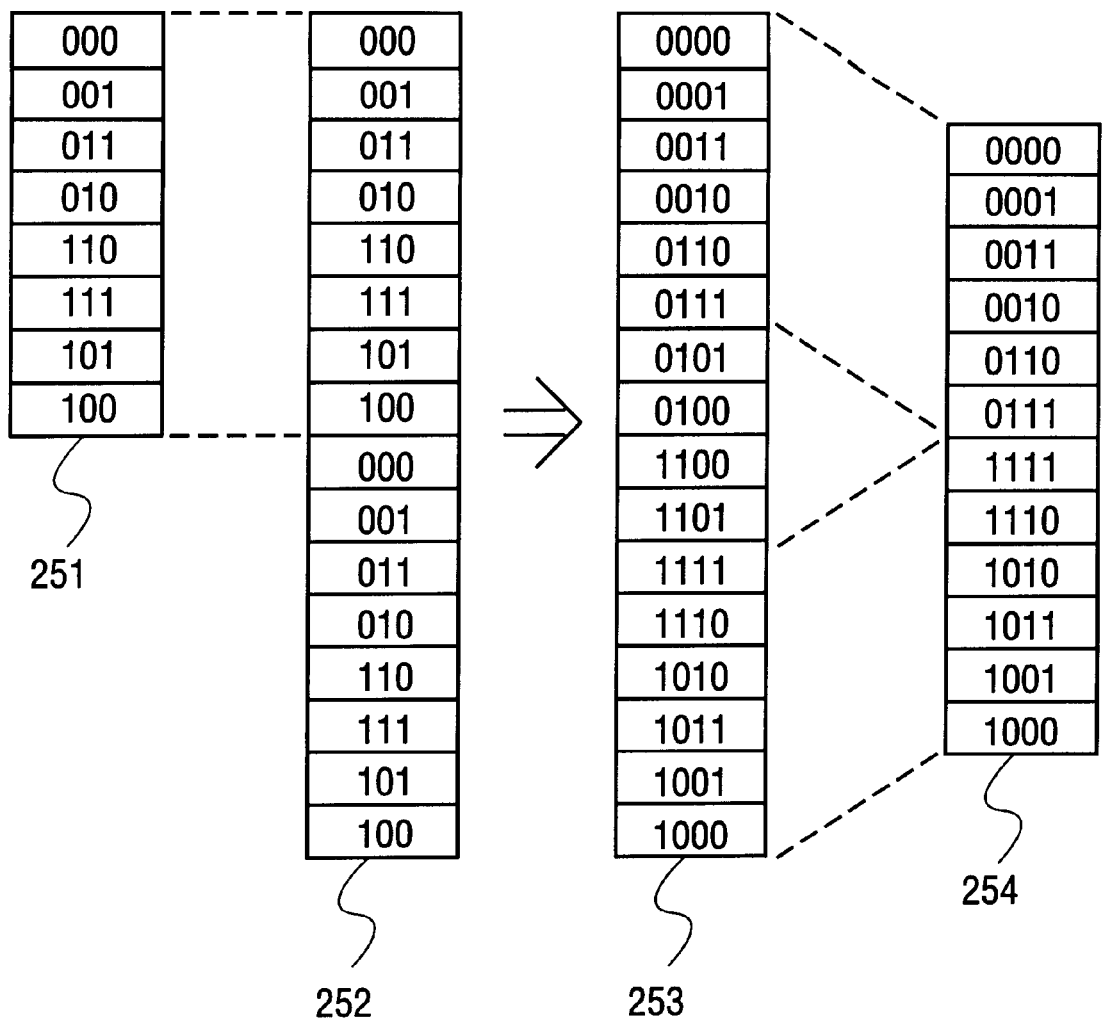
FIG. 4a illustrates creating a 12 bit Gray code from an 8 bit Gray code.

FIG. 4a illustrates the stages in producing a 12 entry Gray code from a known 8 entry Gray code. First, the eight entry Gray code is listed, and then it is listed again in reverse order to obtain Sequence 252. A zero is prepended to each entry in the first half of Sequence 252 (the original 3 bit code), while a one is prepended to each entry in the second half of Sequence 252 (the reverse ordered 3 bit code), resulting in Sequence 253. By following this process, a sixteen entry code is produced, which follows the Gray code rule of only one bit transition from one entry to the next. Finally, the middle four entries are eliminated, reducing the number of entries to twelve and resulting in Sequence 254, but still preserving the Gray code. The one bit transition property is preserved because the reverse ordering of the second half of the new code results in each entry being only one bit removed from the corresponding entry in the opposite half of the sequence. Note that in this case the desired codebook is the 12 entry Gray code, the incrementally larger codebook is the 16 entry Gray code of Sequence 253 and the initial codebook is the 8 entry Gray code.

Figure 4B:
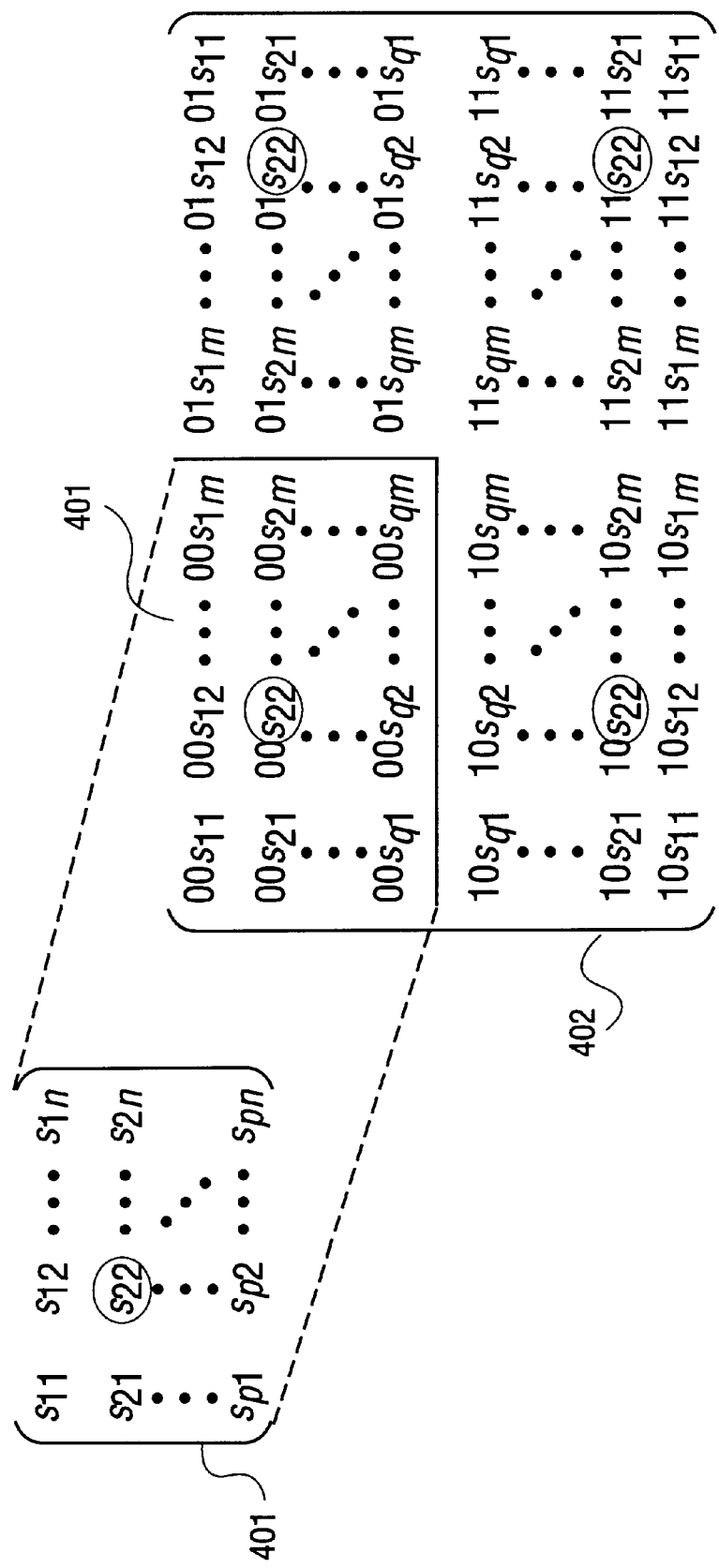
FIG. 4b illustrates the relationships between a codebook with Gray code type properties of size M×N and a codebook with Gray code type properties of size 2M×2N generated from the codebook of size M×N in accordance with one embodiment of the present invention.

FIG. 4b illustrates the relationships between a known good codebook or initial codebook with Gray code type properties of size P×N and a codebook with Gray code type properties of size 2Q×2M generated from the codebook of size P×N. Codebook 401 of size P×N represents a known good codebook or initial codebook having p columns and n rows. Codebook 402 is a codebook of size 2Q×2M, having 2Q columns and 2M rows. The method of FIG. 3a was used to produce Codebook 402 from Codebook 401. Note the position of entry $S_{22}$ in both codebooks. Its position in Codebook 402, where it is replicated 4 times, each instance with a different prefix, illustrates the reflecting technique described in the preceding description of FIG. 3a. Note also that at the boundary between and two quadrants, the adjacent entries across the boundary consist of the same entry from Codebook 401, with prefixes that differ by only one bit. Thus, the Gray code type properties of the codebooks are preserved. For the case where Q=P and M=N, Codebook 402 will be quadruple the size of Codebook 401. Otherwise, the Reducing steps of FIG. 3*a* would result in a codebook of size less than 2P×2N, but still preserving the Gray code type properties in the codebook. Assuming the 2Q×2M codebook is the ultimately needed size it represents a desired codebook, and the 2P×2N codebook represents an incrementally larger codebook. It is possible that the P×N codebook was produced from a smaller initial codebook of size (P/2)×(N/2), in which case the P×N codebook would also have been an incrementally larger codebook compared to the (P/2)×(N/2) codebook.

Figures 5A, 5B:
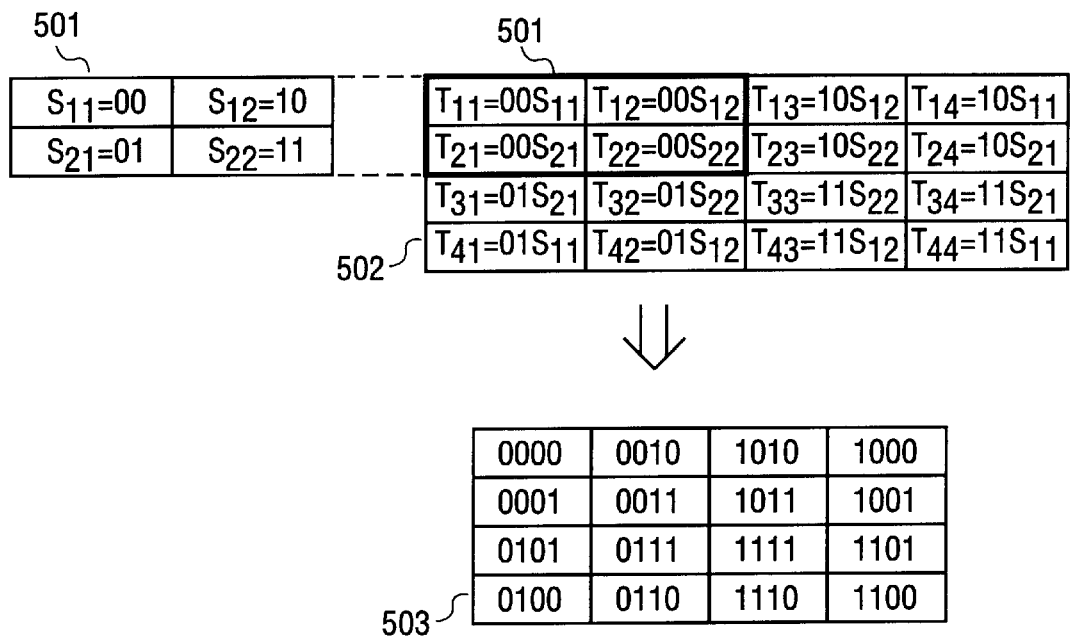

FIG. 5*a* is a 2×2 codebook with Gray code type properties. As is apparent from immediate inspection, only one bit changes when moving between adjacent entries.

FIG. 5*b* is an illustration of the relationship between the 2×2 codebook of FIG. 5*a* and a 4×4 codebook that can be generated from the codebook of FIG. 5*a* by following the process of FIG. 3*a*. As seen in FIG. 4, Codebook 501 is reflected vertically and the resulting 4×2 codebook is reflected horizontally to produce the 4×4 codebook that is Codebook 502. Codebook 503 shows the resulting entries in the 4×4 codebook produced by this method.

Figure 6A:
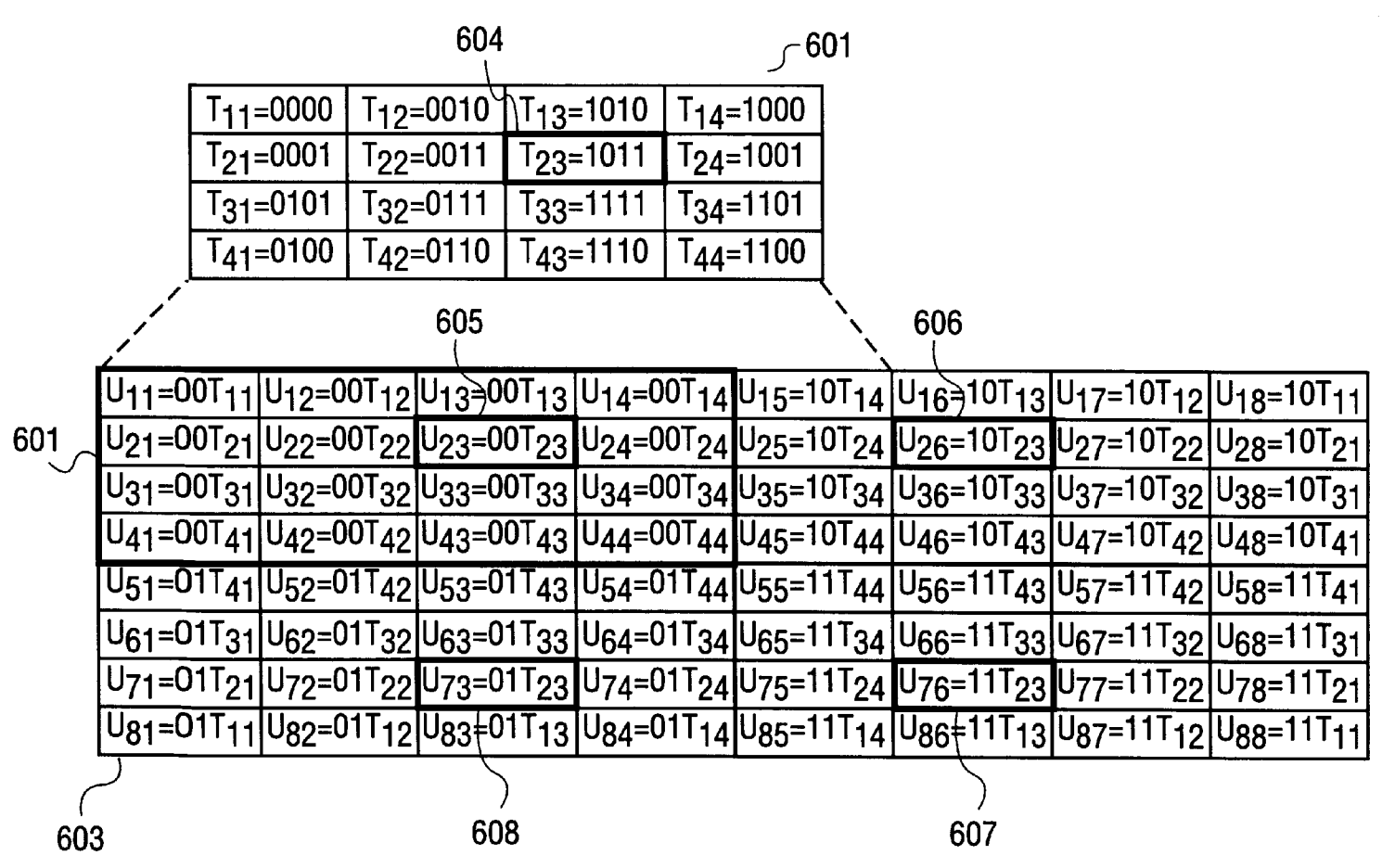

FIG. 6*a* is an illustration of the relationship between the 4×4 codebook of FIG. 5*b* and an 8×8 codebook that can be generated from the codebook of FIG. 5*b* by following the process of FIG. 3*a*. Codebook 601 is a known codebook of size 4×4. It is reflected in the manner of FIG. 3*a*, to produce Codebook 603, of size 8×8. As can be seen by inspecting Entry 604 and resulting Entrys 605, 606, 607, and 608, this method replicates each entry in the codebook four times, prepending a different prefix depending on where the new entry is located.

Figure 6B:
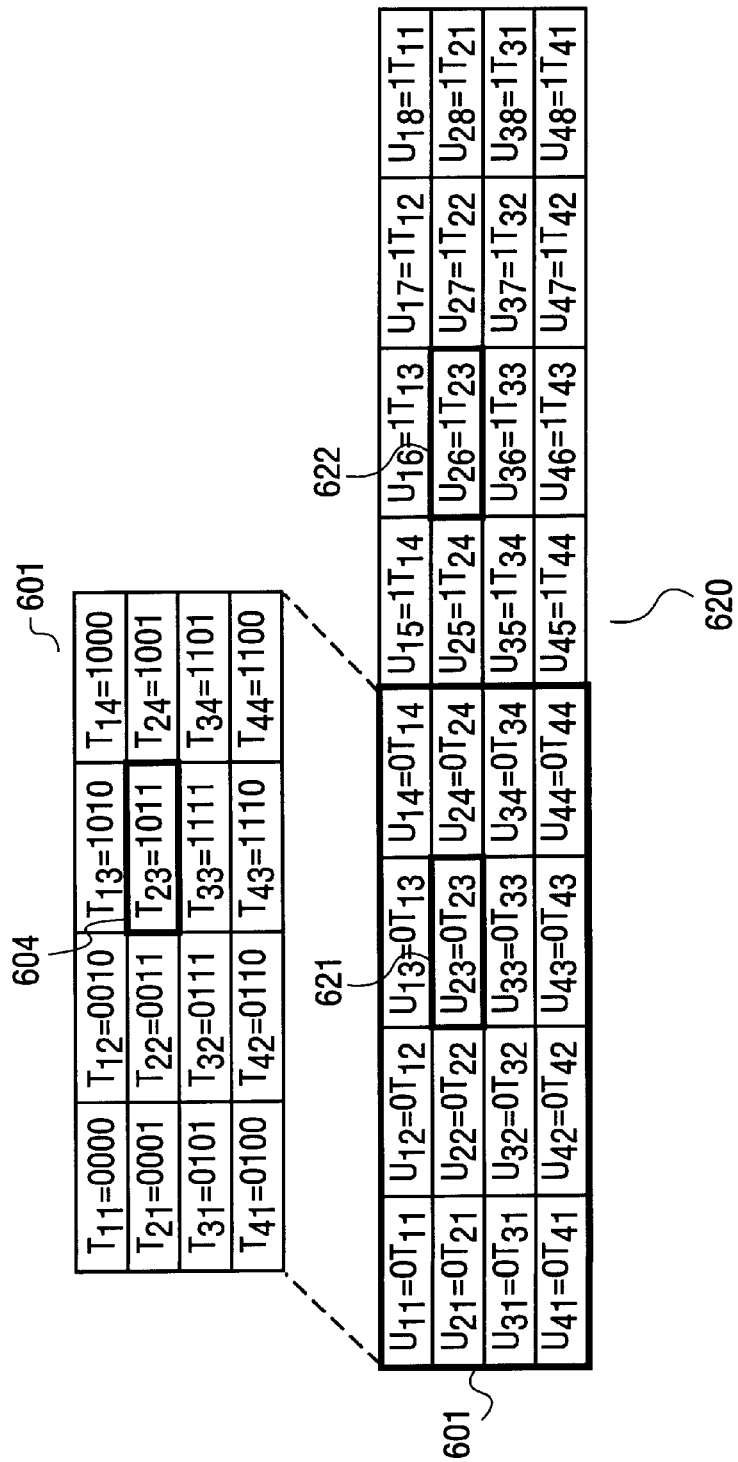

FIG. 6*b* is an illustration of the relationship between the 4×4 codebook of FIG. 5*b* and an 8×4 codebook that can be generated from the codebook of FIG. 5*b* by following the process of FIG. 3*a*. Here, the process starts with 4×4 Codebook 601 as it did in FIG. 6*a*. However, since the desired codebook is 8×4, Codebook 601 need only be reflected vertically to produce Codebook 620. Additionally, Entry 604 is only replicated twice to produce Entrys 621 and 622, each with a single bit prefix prepended to the original bit sequence. Codebook 601 is a balanced codebook because it has an equal number of entries along each axis. Codebook 620 is an unbalanced codebook because it has a greater number of entries along one axis than along another axis. As will be apparent to one skilled in the art, simple modifications of the method disclosed will allow for production of both balanced and unbalanced codebooks of any size.

FIG. 7 is an illustration of the rotation of a row of the 4×4 codebook of FIG. 5*b* from the bottom to the top of the array which does not destroy the Gray code properties of the codebook. In transforming Codebook 701 to Codebook 703, Row 702 is moved from the bottom of a 4×4 codebook to the top of a 4×4 codebook. As is apparent on inspection, the codebook retains the property of having only one bit change when moving between adjacent entries.

FIG. 8 is an illustration of the rotation of a column of the 4×4 codebook of FIG. 5*b* from the left side to the right side of the array which does not destroy the Gray code properties of the codebook. In transforming Codebook 801 to Codebook 803, Column 802 is moved from the right side of a 4×4 codebook to the left side of a 4×4 codebook. As is apparent on inspection, the codebook retains the property of having only one bit change when moving between adjacent entries.

Figure 9:
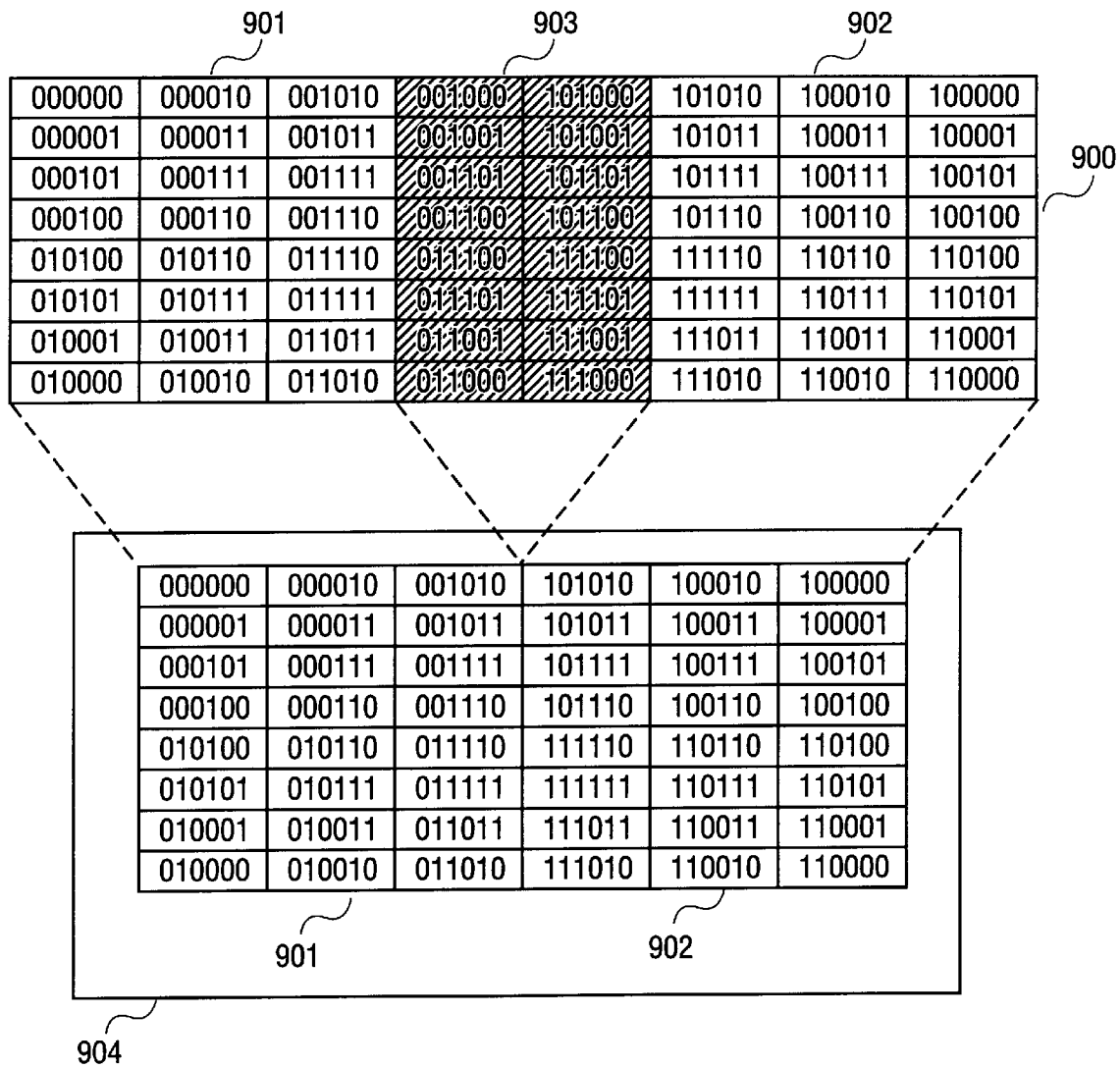
FIG. 9 is an illustration of reducing the 8×8 codebook of FIG. 5c horizontally by two rows to create an 8×6 codebook that maintains Gray code type properties.

FIG. 9 is an illustration of Reducing the 8×8 codebook of FIG. 5*c* Horizontally by two rows to create an 8×6 codebook that still maintains Gray code type properties. Codebook 900 is an 8×8 codebook as generated by the process of FIG. 3*a*. Since an 8×6 codebook is desired, Center Columns 903 are removed from Codebook 900. This leaves leftmost Columns 901 and rightmost Columns 902, which make up Codebook 904. As is apparent from inspection, Codebook 904 still has the same Gray code type properties that Codebook 900 had.

Figure 10:
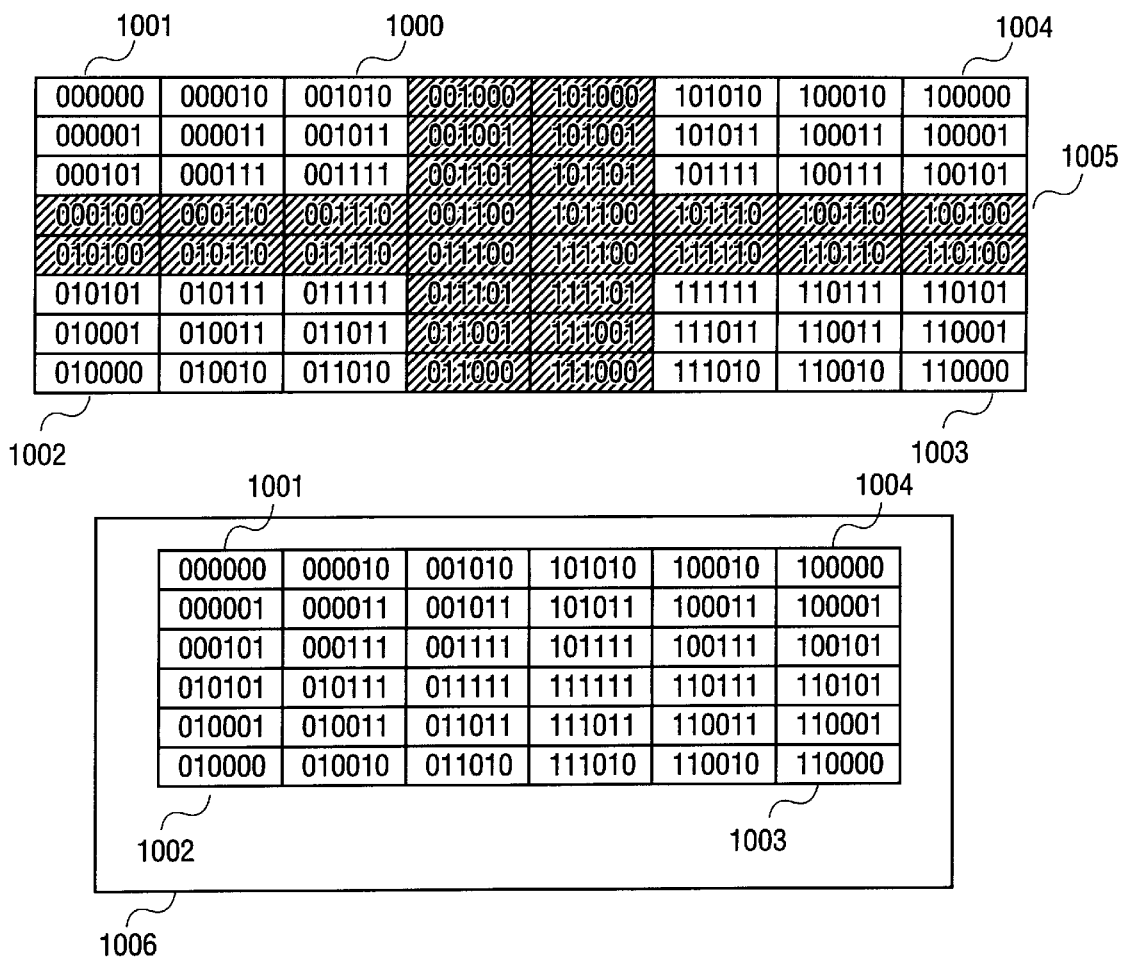
FIG. 10 is an illustration of reducing the 8×8 codebook of FIG. 5c horizontally by two rows and vertically by two columns to create a 6×6 codebook that maintains Gray code type properties.

FIG. 10 is an illustration of Reducing the 8×8 codebook of FIG. 5*c* Horizontally by two rows and Vertically by two columns to create a 6×6 codebook that still maintains Gray code type properties. Codebook 1000 is the same 8×8 codebook as Codebook 900. Reducing Vertically and Reducing Horizontally the 8×8 codebook results in the removal of Central Portion 1005. By removing Central Portion 1005, consisting of two rows and two columns, Top Left Portion 1001, Bottom Left Portion 1002, Bottom Right Portion 1003 and Top Right Portion 1004 now remain. These portions are combined to form 6×6 Codebook 1006.

Figure 11A:
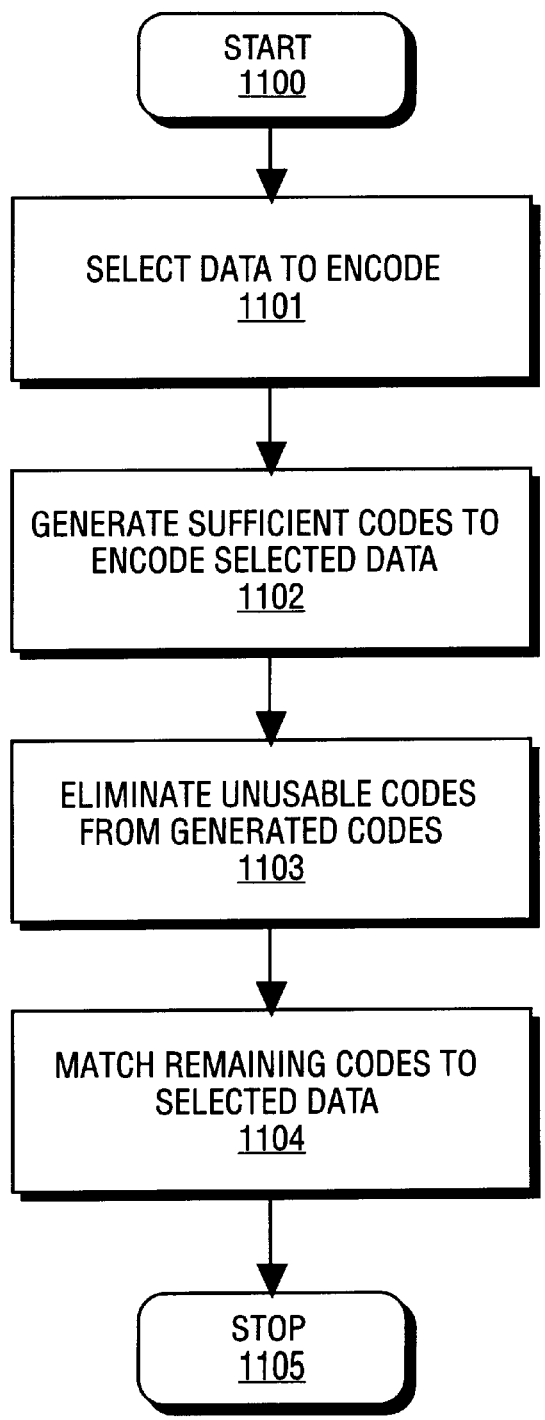
FIG. 11a is a flowchart illustrating a process for creating a Gray code style codebook and applying it to a Huffman encoded data set in accordance with the teachings of the present invention.

FIG. 11*a* is a flowchart illustrating steps for creating a Gray code style codebook and applying it to a Huffman encoded data set. The process starts at Start Point 1100, with a partially generated Huffman code. At Selecting step 1101, the data to be encoded is selected. This would typically be data for which a near-miss to the correct data would be useful in recovering from an error. Examples of such data include data from an array of sensors, where the location of each individual sensor would be encoded to make an error in the code likely to identify the location of a nearby sensor, or JPEG data which encodes a picture and involves data for locations next to each other. Another application is to the motion vector encoding of the MPEG-4 Standard, where it is useful to have an error result in a near miss on the screen rather than sending a piece of an image to a wholly different area of the screen. In the MPEG-4 Motion Vector situation, if a motion vector is encoded incorrectly, this means a portion of an image will move in a direction or at a distance not intended. By making an error in a motion vector result in a similar motion vector, the resulting movement of the portion of an image will more closely approximate the expected motion, and thus be less apparent to the user.

Note that the above descriptions indicate some of the statistical relationships between various data points that can exist, or describe how data points can be statistically similar. This method of generating a codebook can be applied to any data with inherent continuity, and some form of statistical similarity inevitably results from such continuity. In particular, the type of continuity represented by such phenomena as points on a line or plane is suitable, but other forms of continuity resulting from relations within the data is suitable for this method and will result in the necessary statistical similarity. Statistical similarity can arise from data points having similar locations, such as physically side-by-side, physically equidistant from a common point, or physically separated by a certain distance or series of distances. Likewise, statistical similarity can arise from virtually similar locations, such as similar locations within a set of data in a computer, similar memory locations, and the like. Other forms of statistical similarity can include cost of encoding or bit length of code, average length, variance of length, Hamming distance of codes can form a basis for statistical similarity. Statistical similarity can arise after a set of data points is encoded through use of another technique such as Huffman encoding. Other forms of statistical similarity will be readily apparent to one skilled in the art, and statistical similarity will often involve properties unique to a set of data points.

Once the data is selected, the process flows to Generation step 1102. At Generation step 1102, sufficient codes are generated using the techniques of FIGS. 3a and 3b or a similar method to produce a Gray code type of encoding. For FIG. 11c, the generation of the codes in the four boxes adjacent to the center box involved generating a set of sixteen 4 bit codes from a one dimensional Gray code. The reason for this is that these four boxes actually represent a circular pattern divided into segments, where the box that should be adjacent is the box diagonal to a given entry. Since a circle divided into segments is generally linear, a one dimensional Gray code is appropriate. Also, since these codes will be used in a Huffman code, utilizing four bits instead of three was appropriate. As was noted, Huffman codes require that no code be the prefix for another code. If only three bits were used, this would eliminate half of all possible longer codes to fill the four boxes. Thus, the set of codes would be the sixteen codes generated: 0000, 0001, 0011, 0010, 0110, 0111, 0101, 0100, 1100, 1110, 1111, 1101, 1001, 1011, 1010, 1000. Each code of this set of codes has the Gray code property of requiring only one change in one bit to move from one code to an adjacent code.

From Generation step 1102, the process proceeds to Elimination step 1103. Here, all codes that interfere with the Huffman constraint established by previously generated codes are eliminated from consideration. Of the sixteen codes generated, the four beginning with 11 must be eliminated because the center box is already encoded 11, and these four codes constitute unusable codes in this embodiment. This leaves twelve remaining codes, 0000, 0001, 0011, 0010, 0110, 0111, 0101, 0100, 1001, 1011, 1010, 1000.

The process then flows to Matching step 1104, where the codes are matched to the data to be encoded. In this case, two pairs of the codes are chosen and located in the four locations provided, thereby providing a code without undue bit transitions when moving from one entry to an adjacent entry. Note that the codes as selected provide two discontinuities. These exist so that there is less likelihood of entries directly opposite each other from being confused. However, by choosing four codes in sequence, such as 0110, 0111, 0101, 0100, these discontinuities could be eliminated. Thus, this matching step may be implemented in a variety of ways depending on the preferences or priorities shaping the process.

Figure 11B:
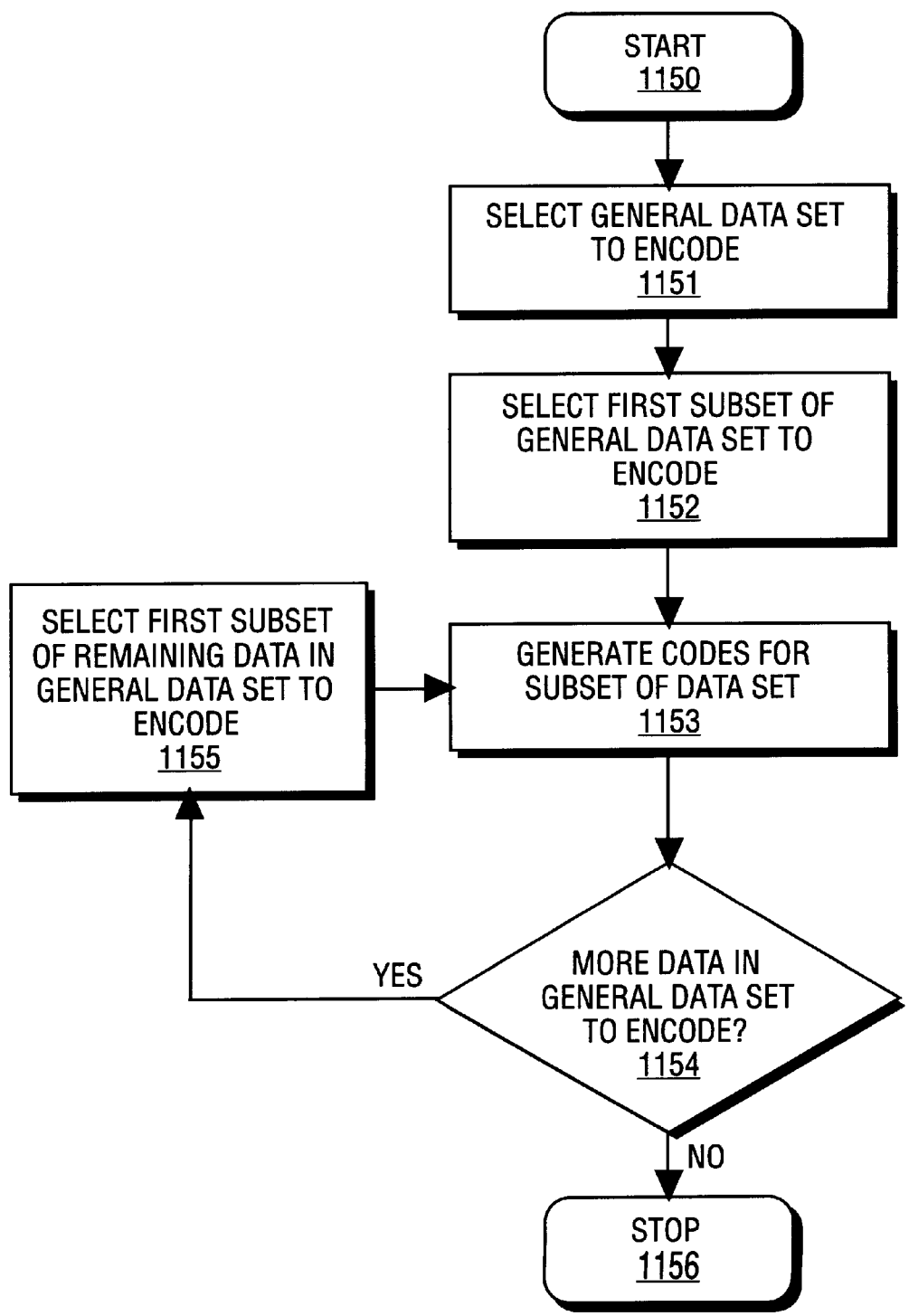
FIG. 11b is a flowchart illustrating a process for generating a group of Gray code style codebooks and applying them to a Huffman encoded data set in accordance with the teachings of the present invention.

FIG. 11b is a flowchart illustrating steps for generating a group of Gray code style codebooks and applying them to a Huffman encoded data set. FIG. 11b essentially breaks down a set of data into subsets and uses the method of FIG. 11a to encode each subset. Referring again to FIG. 11c, the whole set of data of FIG. 11c can be taken as the Data Set selected in Selection step 1151. In Subset Selection step 1152, the first subset of data is selected. As discussed with regard to FIG. 11a, that first subset would be the four boxes nearest the center box. Next comes Generation step 1153, which involves utilizing the process outlined in the description of FIG. 11a to encode the selected subset of data. Next comes Determination step 1154, which determines whether more data needs to be encoded. In this case, only the five shaded boxes of FIG. 11c have been encoded at this time, so more data needs to be encoded.

This takes the process to Subset Selection step 1155, which involves selecting from the remaining data in the set of data another subset to encode. In this case, each of the boxes with a six bit code in FIG. 11c were selected. These boxes were selected because in the MPEG-4 Standard, these boxes form a circle which has roughly an equal probability of showing up as a Motion Vector for any point along the circle. As a result, it is valuable to have all of these boxes encoded in a Gray code style code. Having selected this subset of data, the process flows again to Generation step 1153, which involves utilizing the method of FIG. 11a again to generate codes. Next, the process goes again to Determination step 1154. If no more data needs to be encoded, then the process stops and the code has been generated. If more data needs to be encoded, then the process would again go to Selection step 1155.

FIG. 11c is an MPEG-4 style codebook with codes for the center locations replaced by codes generated utilizing the steps of FIGS. 11a and 11b. Note that three circular shaped regions were processed in this manner. The first region has only four bit codes and represents the four boxes adjacent to the center box. The second region has six bit codes and is a region two boxes deep surrounding the first region. The last region has eight bit codes and is a region one box deep surrounding the second region. Each region represents an area where the boxes have approximately equal possibilities of being encoded as a Motion Vector under the MPEG-4 Standard. The area included by the three regions represents approximately 90% of the locations encoded as Motion Vectors under the MPEG-4 Standard. The similar statistical probabilities of each box in a given region represent one form of statistical similarity between each of the boxes in the region in question. This statistical similarity is involved in determining which data points to select for a given subset and what type of code to generate for those data points.

The original MPEG-4 encoding was a Huffman code that represented excellent compression for the Motion Vectors it encoded. However, a difference in one bit in the code could easily result in the motion vector pointing in the exact opposite direction. By utilizing succesive Gray codes, errors in transmission of a Motion Vector are more likely to put the received Motion Vector in a location near the transmitted Motion Vector. Additionally, since the Huffman codes that were replaced by the Gray codes were approximately the same in length, the compression ratio of the code is nearly the same for the new Gray code as it was for the old Huffman code. In particular, the second region, which has a six bit Gray code, was originally composed of boxes having a code between five and seven bits in length, so the average bit length of the codes for all of these boxes remains constant. As a result the advantages of robustness are achieved, without serious disadvantages in terms of the compression ratio.

Figure 12A:
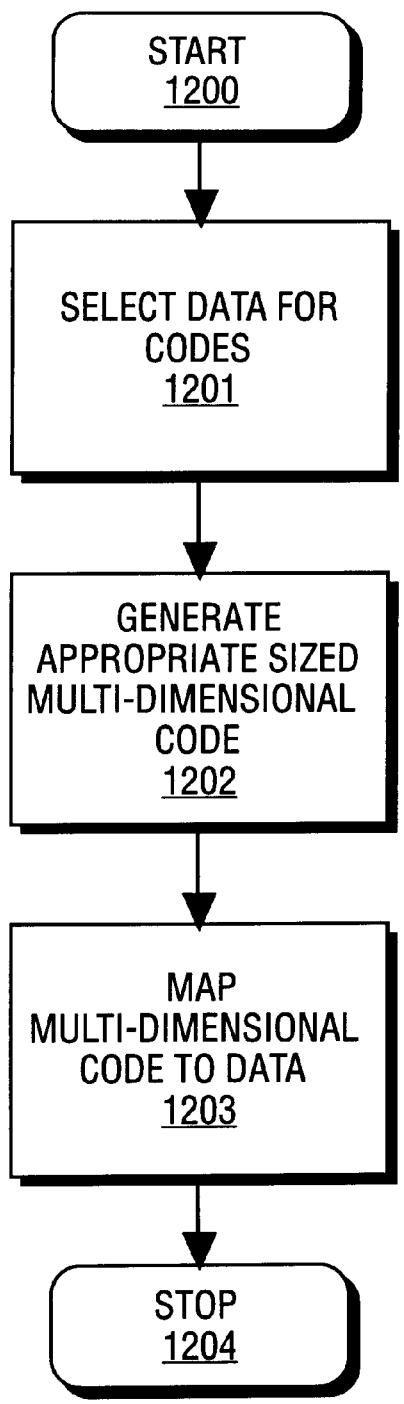
FIG. 12a is a flowchart illustrating a process for creating a multi-dimensional codebook and determining how the resulting codes should correspond to data in accordance with the teachings of the present invention.

FIG. 12a is a flowchart illustrating steps for creating a multi-dimensional codebook and determining how the resulting codes should correspond to data. Unlike the process of FIGS. 11a and 11b, this process does not consider Huffman codes, and it is more suited to a set of data that has equal probabilities for each location. The process begins at Start point 1200 and proceeds to Selection step 1201. At Selection step 1201, the data set to be encoded is selected, as it was in Selection step 1151 of FIG. 11b. Next, the process flows to Generation step 1202, where an appropriate multi-dimensional codebook is generated. In the case of the dataset of FIG. 11c, utilizing only the first two regions requires an 8×8 codebook be generated. The 8×8 Codebook 1252 of FIG. 12 illustrates this. Next, the process flows to Mapping step 1203, where the locations of the data set are mapped to the codebook generated in Generation step 1202.

This can be seen by observing the overlaid Section 1251, which when shown without the rest of Codebook 1252 shows the six bit Gray code style codebook which can cover this data set.

Figure 13:
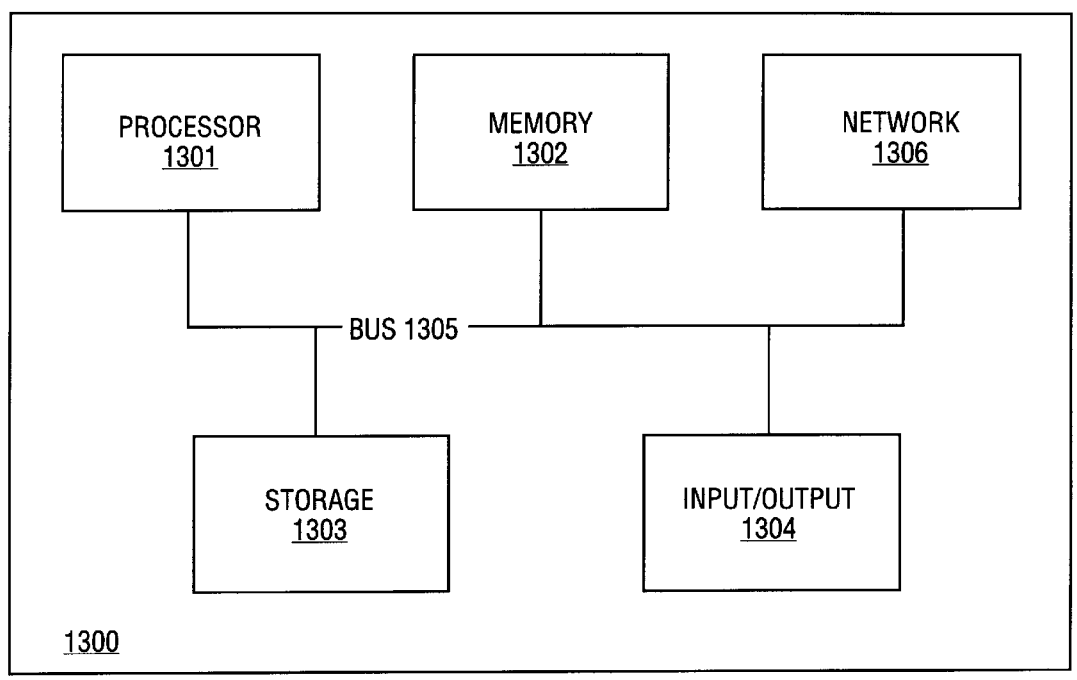
FIG. 13 illustrates a general computer.

FIG. 13 illustrates a general computer, including Processor 1301, Memory 1302, Network 1306, Storage 1303, Input/Output 1304 and Bus 1305. Processor 1301 executes instructions, thereby controlling to some degree each of the other components. Memory 1302 may include static and dynamic elements, and may be composed of RAM, ROM, or other forms of memory known to those skilled in the art. Storage 1303 may likewise be composed of RAM or ROM, and can be composed of other machine-readable media, including but not limited to disks, tapes, carrier waves, and the like. Input/Output 1304 can be any number of components capable of supplying data to a processor, including but not limited to keyboards, scanners, touch-sensitive screens, microphones, and the like; or it may be any number of components capable of receiving data from a processor for transmission outside the system, including but not limited to screens, printers, speakers, and the like. Network 1306 can be a local connection to an office network, the Internet, a telephone network, or any other possible network connection apparent to those skilled in the art. Bus 1305, while shown here as interconnecting all components, can connect only Processor 1301 to each component, can restrict the flow of information to only one direction, and generally allows flow of information between components. It will be appreciated by those skilled in the art that Computer System 1300 can be composed of a only some of the illustrated components and still function, and that innumerable arrangements of these components, along with other components not pictured, will still perform the same functions as Computer System 1300 in the same way, with the same result. In particular though, Computer System 1300 can be configured or programmed to carry out the teachings of the present invention to design a codebook as illustrated in the foregoing figures.

It will be appreciated by one skilled in the art that a codebook of two (or more) dimensions could be generated through a variety of other means that still embody the teachings of the present invention. In an alternative embodiment, a linear Gray code is generated, and then a two dimensional codebook with Gray code properties (or multi-dimensional Gray code properties) could be generated therefrom by replicating the code along an axis orthogonal to the original list of codes and prepending a second sequence of bits to each entry, such that the second sequence of bits has a Gray code property along the axis orthogonal to the original list of codes. This methodology could be extended to higher dimensions without undue experimentation by one skilled in the art. However, this method is not illustrated to avoid obscuring the invention.

It will be appreciated by one skilled in the art that this process could easily be used for any two dimensional codebook. For instance, a 14×12 codebook would involve production of first a 4×4 and then an 8×8 codebook before finally generating a 14×12 codebook. Likewise, the process would require simple modification using well-known techniques to produce a codebook of a form such as 12×4 where the step of producing an 8×8 codebook would become producing an 8×4 codebook that could then be used to produce a 12×4 codebook. It is also notable that this process, while deterministic in any one implementation, can produce a variety of codebooks for the same set of data points depending on how the process is implemented. Additionally, it will be appreciated by one skilled in the art that generalizing this process to generate codebooks in higher dimensions also can be achieved through well known techniques. In particular, the reflection steps utilized at higher dimensions generally involve replicating the current set of codes in a reverse order and then prepending the appropriate prefix bit or bits to produce a larger codebook in the higher dimension. For instance, generation of codebooks in three dimensions would require replicating an initial codebook along three axes, using one bit per axis, but otherwise following the steps of FIGS. 3*a* and 3*b*. Additionally, both balanced and unbalanced codebooks of higher dimensions can be produced. In three dimensions, a balanced codebook would take the form of a cube, with an equal number of entries along each axis, whereas an unbalanced codebook would take a form of something other than a cube, with an unequal number of entries along all three axes. For higher dimensions, any hypercube with equal entries along each axis would represent a balanced codebook, and any other form would represent an unbalanced codebook. For a given set of data points, there may be a variety of both balanced and unbalanced codebooks that will still achieve the objectives of a robust and compressive encoding of the set of data points.

One skilled in the art will likewise appreciate that a series of subcodes can be generated, each subcode generated through one of the processes already described, and then the series of subcodes can be combined to form a codebook, with unusable codes eliminated as required by the constraints both of the system using the code and of the type of code generated. Note that even a single data point could be encoded using this system, either as a subcode for a larger code or as a single code.

Also, one skilled in the art will appreciate that this process can be implemented in a variety of ways, utilizing a variety of apparatuses. For instance, this could be implemented using software, hardware, or some combination or hybrid thereof. Instructions contained on a machine readable medium such as but not limited to a magnetic disk, optical disk, tape, carrier wave could be used to cause a machine to implement the steps of the process of the present invention. Likewise, one skilled in the art will appreciate that a machine such as an Application Specific Integrated Circuit, Programmable Logic Device, or Programmable Gate Array can be used to implement the steps of the present invention, and a computer or other system can be configured, either by executing instructions or by other means, to implement the steps of the present invention. Certainly, one skilled in the art will appreciate that many other alternative implementations and embodiments of the present invention exist.

In the foregoing detailed description, the method and apparatus of the present invention have been described with reference to specific exemplary embodiments thereof. It will, however, be evident that various modifications and changes may be made thereto without departing from the broader spirit and scope of the present invention. As an example, all illustrated transformations and expansions of the codes were done for one or two dimensional codebooks, but a similar method for generating a three or more dimensional codebook would be a modification within the spirit and scope of the present invention. Elaboration into other possible modifications has been omitted in order to not unnecessarily obscure the teachings of the present invention. The present specification and figures are accordingly to be regarded as illustrative rather than restrictive.

What is claimed is:

1. A method of generating a codebook of codes for data points having error resilient properties comprising:

selecting a set of data points to encode, the set of data points having statistical relationships between the data points;

selecting a first subset of data points from the set of data points, each data point of the first subset of data points having statistical similarity to each other data point of the first subset of data points; and generating a first set of codes for the first subset of data points, each code of the first set of codes corresponding to a data point of the first subset of data points, the first set of codes having Gray code properties.

2. A method of generating a codebook of desired size for a set of data points comprising:

determining whether a codebook larger than an incrementally larger size is needed;

if a codebook larger than incrementally larger size is needed, generating a codebook of incrementally larger size from a codebook of current size, redefining a codebook of incrementally larger size to be a codebook of current size;

determining whether a codebook larger than incrementally larger size is needed;

if a codebook of incrementally larger size is needed, repeating said step of generating and redefining and said step of determining, thereby generating progessively larger codebooks, until a codebook larger than incrementally larger size is not needed; and if a codebook larger than incrementally larger size is not needed, generating a codebook of desired size.

3. A machine readable medium comprising instructions which, when executed by a processor, generate a codebook of codes having error resilient properties comprising:

selecting a set of data points to encode, the set of data points having statistical relationships between the data points;

selecting a first subset of data points from the set of data points, each data point of the first subset of data points having statistical similarity to each other data point of the first subset of data points; and generating a first set of codes for the first subset of data points, each code of the first set of codes corresponding to a data point of the first subset of data points, the first set of codes having Gray code properties.

4. A processing system comprising a processor and memory, said system configured to generate a codebook of codes having error resilient properties by executing instructions to select a set of data points to encode, the set of data points having statistical relationships between the data points;

select a first subset of data points from the set of data points, each data point of the first subset of data points having statistical similarity to each other data point of the first subset of data points; and generate a first set of codes for the first subset of data points, each code of the first set of codes corresponding to a data point of the first subset of data points, the first set of codes having Gray code properties.

5. A codebook for encoding a set of data points, the codebook having been generated by selecting a set of data points to encode, the set of data points having statistical relationships between the data points; selecting a first subset of data points from the set of data points, each data point of the first subset of data points having statistical similarity to each other data point of the first subset of data points; and generating a first set of codes for the first subset of data points, each code of the first set of codes corresponding to a data point of the first subset of data points, the first set of codes having Gray code properties.

6. A method of generating a codebook of codes for data points having error resilient properties comprising:

selecting a set of data points to encode, the set of data points having statistical relationships between the data points;

selecting a first subset of data points from the set of data points, each data point of the first subset of data points having statistical similarity to each other data point of the first subset of data points;

generating a first set of codes for the first subset of data points, each code of the first set of codes corresponding to a data point of the first subset of data points, the first set of codes having Gray code properties;

repeating said step of selecting a subset of data points and said step of generating a set of codes for each subset of said set of data points to encode until said set of data points to encode has no data points remaining to encode, the codebook of codes being formed from the codes generated in each step of generating a set of codes.

* * * * *